(12) United States Patent
Xiaochun et al.

(10) Patent No.: US 7,682,874 B2
(45) Date of Patent: *Mar. 23, 2010

(54) CHIP SCALE PACKAGE (CSP) ASSEMBLY APPARATUS AND METHOD

(75) Inventors: Tan Xiaochun, Shanghai (CN); Li Yunfang, Shanghai (CN)

(73) Assignee: Shanghai KaiHong Technology Co., Ltd. (CN)

( * ) Notice: Subject to any disclaimer, the term of this patent is extended or adjusted under 35 U.S.C. 154(b) by 763 days.

This patent is subject to a terminal disclaimer.

(21) Appl. No.: 11/483,861

(22) Filed: Jul. 10, 2006

(65) Prior Publication Data

US 2008/0014677 A1    Jan. 17, 2008

(51) Int. Cl.
*H01L 21/00* (2006.01)
*H01L 21/44* (2006.01)

(52) U.S. Cl. .................... 438/112; 438/113; 438/118; 438/465; 438/613; 257/E21.503

(58) Field of Classification Search ................ 438/112, 438/113, 118, 465, 613; 257/E21.503
See application file for complete search history.

(56) References Cited

U.S. PATENT DOCUMENTS

| | | | | |
|---|---|---|---|---|
| 5,729,437 | A * | 3/1998 | Hashimoto | 361/760 |
| 5,817,541 | A | 10/1998 | Averkiou et al. | |
| 6,110,755 | A * | 8/2000 | Muramatsu et al. | 438/26 |
| 6,338,980 | B1 * | 1/2002 | Satoh | 438/106 |
| 6,420,244 | B2 | 7/2002 | Lee | |
| 6,649,448 | B2 * | 11/2003 | Tomihara | 438/113 |
| 6,732,913 | B2 | 5/2004 | Alvarez | |
| 6,830,957 | B2 * | 12/2004 | Pu et al. | 438/108 |
| 6,906,415 | B2 * | 6/2005 | Jiang et al. | 257/723 |
| 6,908,784 | B1 * | 6/2005 | Farnworth et al. | 438/106 |
| 7,413,927 | B1 * | 8/2008 | Patwardhan et al. | 438/108 |
| 2003/0155641 | A1 | 8/2003 | Yeo et al. | |
| 2004/0053443 | A1 * | 3/2004 | Kumamoto et al. | 438/106 |
| 2007/0059865 | A1 * | 3/2007 | Huang et al. | 438/123 |
| 2007/0155049 | A1 * | 7/2007 | Tsai | 438/106 |

* cited by examiner

*Primary Examiner*—Walter L Lindsay, Jr.
*Assistant Examiner*—Ron Pompey
(74) *Attorney, Agent, or Firm*—Fountainhead Law Group PC

(57) ABSTRACT

In one embodiment the present invention includes a method of fabricating a chip scale package (CSP). The method includes forming conductive bumps on a top side of a semiconductor wafer; mounting the top side of the semiconductor wafer on adhesive tape; sawing the semiconductor wafer a first time such that a wide sawing kerf is obtained; molding the semiconductor wafer with a molding compound; and sawing the semiconductor wafer a second time to obtain the CSPs. Such method has improved efficiency as compared to many existing methods of fabricating CSPs.

18 Claims, 4 Drawing Sheets

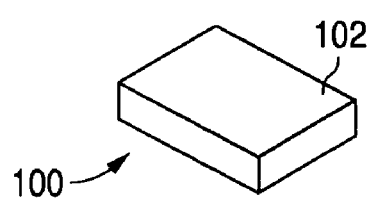
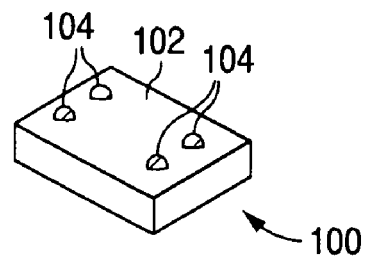
FIG. 1A  FIG. 1B
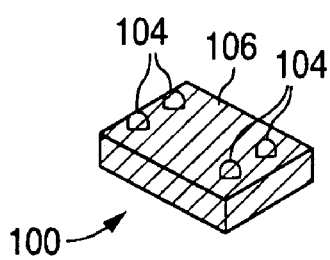
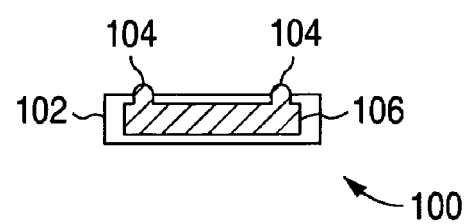
FIG. 1C  FIG. 1D
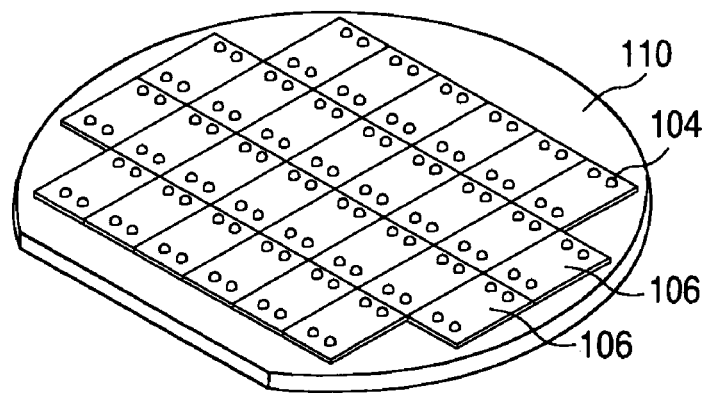
FIG. 2

CHIP SCALE PACKAGE (CSP) ASSEMBLY APPARATUS AND METHOD

CROSS REFERENCE TO RELATED APPLICATIONS

Not applicable.

BACKGROUND

The present invention relates to chip scale package (CSP) fabrication processes, and in particular, to CSP fabrication processes for flip chips.

In some types of semiconductor chips, the conductive pads of the chip are connected via conductive wire leads to a lead frame, and the lead frame connects the wire leads to the pins on the semiconductor package. In contrast, other types of semiconductor chips are termed flip chips. In a flip chip, conductive balls or bumps are formed on the chip, and the chip is "flipped over" in the package to connect (via a substrate or other structure) to the conductive structures of the pins. Such a flip chip does not require a lead frame or wire leads, and may therefore be made smaller than a package having a lead frame.

A typical process for fabricating a flip chip is as follows. First, semiconductor fabrication processes form the semiconductor structures on a semiconductor wafer. Second, conductive bumps or balls are formed on the top of the wafer. Third, the wafer is mounted on top of adhesive tape with the bumps on the side of the wafer opposite the tape. Fourth, the wafer is sawed into individual dies. Fifth, each individual die is flipped, mounted onto a substrate, and molded into a semiconductor package.

A number of problems arise from the above-described typical flip chip fabrication process. One such problem arises during flip chip bonding. During flip chip bonding, it is difficult to inspect the device and it is easy to cause quality issues. In addition, the bonding process is relatively high in both machine usage and raw material usage, so it is desired to develop a more efficient process.

Thus, there is a need for improved CSP fabrication processes. The present invention solves these and other problems by providing improved processes for flip chip fabrication.

SUMMARY

Embodiments of the present invention improve upon the process of fabricating flip chips. In one embodiment, the present invention includes a method of fabricating a chip scale package (CSP). The method includes mounting the top side of the semiconductor wafer on adhesive tape; sawing the semiconductor wafer a first time such that a wide sawing kerf is obtained; molding the semiconductor wafer with a molding compound; and sawing the semiconductor wafer a second time to obtain the CSPs.

In another embodiment, the present invention includes a CSP produced by the above method.

The above method has improved efficiency as compared to many existing methods of fabricating CSPs.

The following detailed description and accompanying drawings provide a better understanding of the nature and advantages of the present invention.

BRIEF DESCRIPTION OF THE DRAWINGS

FIGS. 1A, 1B and 1C are perspective views of a chip scale package (CSP) according to an embodiment of the present invention.

FIG. 1D is a cross-sectional view of the CSP shown in FIG. 1A.

FIG. 2 is a perspective view semiconductor wafer according to an embodiment of the present invention.

DETAILED DESCRIPTION

Figure 3:
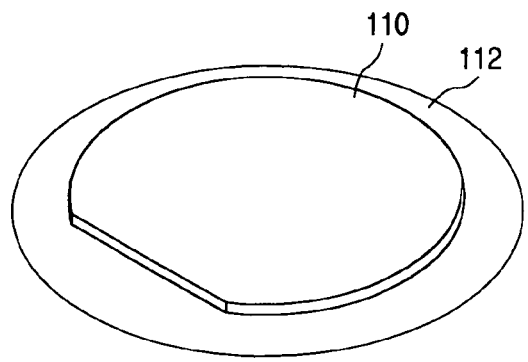
FIG. 3 is a perspective view of the wafer of FIG. 2 mounted on adhesive tape according to an embodiment of the present invention.

Described herein are techniques for CSP fabrication processes. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include obvious modifications and equivalents of the features and concepts described herein.

The following description uses the terms "bump" and "conductive bump". These terms are used interchangeably. Equivalent terms include "ball" and "conductive ball". Such bumps may be formed using solder, gold, or other conductive materials. The term "conductive bump" is used to refer to all these and similar types of structures in flip chips.

The following description describes various methods and processes. Although the particular method steps are discussed in a particular order, such discussion is mainly for clarity of presentation. It should be recognized that such order may be varied, and some steps may be performed in parallel. One step need only follow another step when the other step must be completed before the one step begins.

Before giving the details of a method according to an embodiment of the present invention, FIG. 1A through FIG. 6 are briefly discussed to provide visual context for the method.

FIG. 1A is a top perspective view of a chip scale package (CSP) 100 according to an embodiment of the present invention. The outer package 102 is molded around the interior structures of the chip (not shown). The interior structures of the chip may be formed according to semiconductor fabrication methods, and may also be referred to collectively as a die.

FIG. 1B is a bottom perspective view of the CSP 100 of FIG. 1A. Conductive bumps 104 protrude outside the outer package 102. The conductive bumps 104 connect the semiconductor structures of the die to external connections.

FIG. 1C is a bottom perspective view of the CSP 100 of FIG. 1A without the outer package 102. The interior structures 106 of the chip may be seen, as well as the conductive bumps 104.

FIG. 1D is a cross-sectional view of the CSP 100 of FIG. 1A. This figure shows that the outer package 102 is molded around the interior structures 106 of the chip. The conductive bumps 104 protrude outside of the outer package 102.

FIG. 2 is a perspective view of a semiconductor wafer 110 according to an embodiment of the present invention. The conductive bumps 104 are formed on the top surface of the wafer 110. The wafer 110 is fabricated as a collection of dies 106. The dies 106 are spaced apart by a spacing width on the wafer 110. Twenty-eight such dies 106 are shown in the wafer 110. The number of dies 106 in a wafer may vary according to the size of the wafer, the size of the die, and the desired spacing width between dies.

FIG. 3 is a perspective view of the wafer 110 of FIG. 2 mounted on adhesive tape 112. The wafer 110 has been flipped over such that its top surface contacts the adhesive tape 112.

Figure 4:
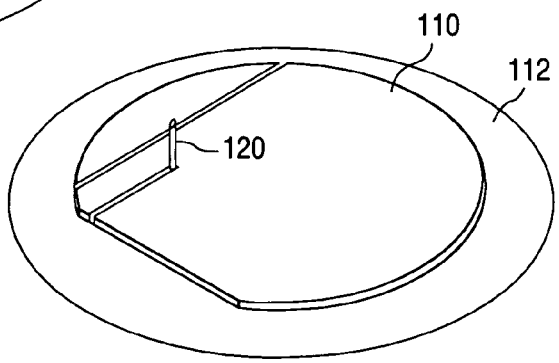
FIG. 4 is a perspective view of the mounted wafer of FIG. 3 being sawed according to an embodiment of the present invention.

FIG. 4 is a perspective view of the mounted wafer of FIG. 3 being sawed by a blade 120. The path of the blade 120 follows the spacing width between the dies. The groove cut by the blade 120 is referred to as a kerf.

Figure 5:
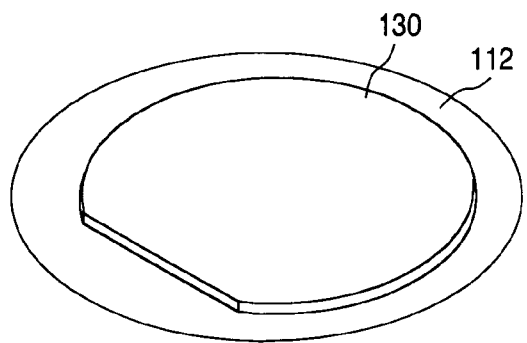
FIG. 5 is a perspective view of the sawed, mounted wafer of FIG. 4 having been covered in molding compound according to an embodiment of the present invention.

FIG. 5 is a perspective view of the sawed, mounted wafer of FIG. 4 having been covered in molding compound 130. The molding compound 130 covers the dies (not visible) and fills in the kerfs between the dies.

Figure 6:
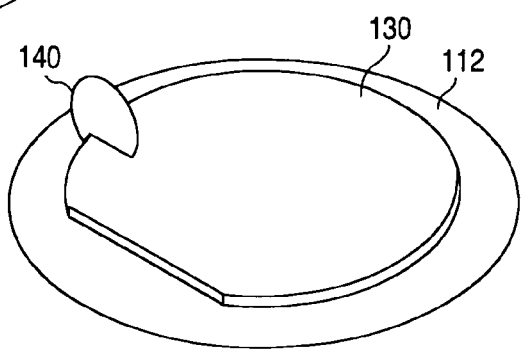
FIG. 6 is a perspective view of the molded wafer of FIG. 5 being sawed a second time according to an embodiment of the present invention.

FIG. 6 is a perspective view of the molded wafer of FIG. 5 being sawed a second time by a blade 140. The path of the blade 140 follows the kerfs between the dies cut by the blade 120 (see FIG. 4) that were filled with molding compound (see FIG. 5). After having been sawed this second time, the individual CSPs 100 result (see FIGS. 1B and 1D).

Figure 7:
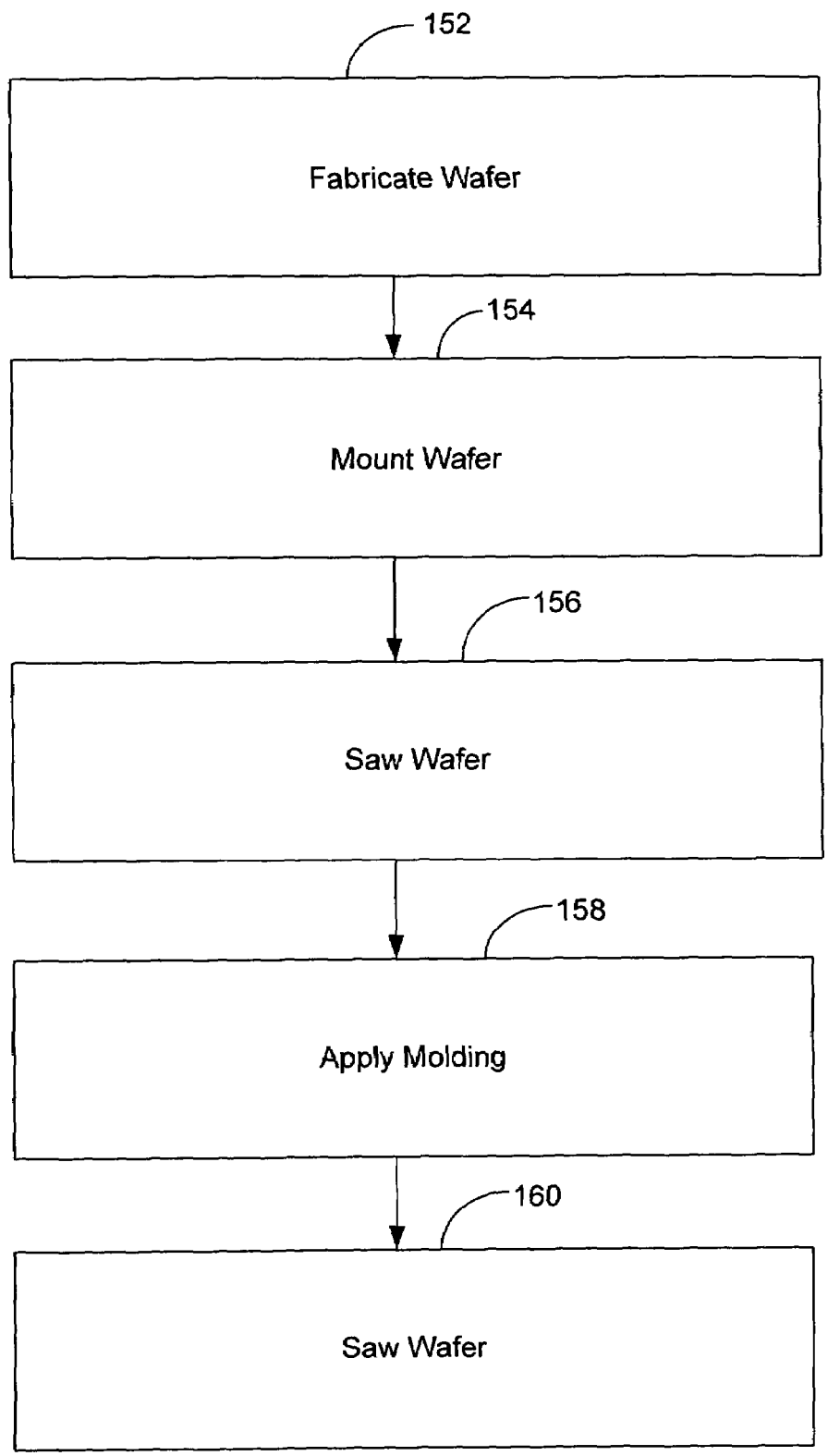
FIG. 7 is a block diagram of a method of fabricating a CSP according to an embodiment of the present invention.

FIG. 7 is a block diagram of a method 150 according to an embodiment of the present invention. Where appropriate, the method steps refer to the structures illustrated in the previous figures.

In step 152, the semiconductor structures on the wafer 110 are fabricated (see FIG. 2). The conductive bumps 104 are also fabricated on the wafer 110. The pitch of the bumps may be determined by the die pad layout. The pitch of the bumps may also consider the surface mount technology (SMT) capability because the bump pitch determines the package lead pitch as well. The CSP die pad layout may also consider the footprint of the printed circuit board. Accordingly, the conductive bumps may be formed in accordance with a footprint of a printed circuit board. The dies 106 are spaced apart by the spacing width.

In step 154, the wafer 110 is mounted on the adhesive tape 112 (see FIG. 3). The wafer 110 is flipped over such that its top surface contacts the adhesive tape 112. Alternatively, the adhesive tape 112 may be placed on top of the wafer 100, and the resulting wafer/tape combination itself flipped over. The bumps 104 may contact the adhesive tape 112, and may be caved in a certain depth to the adhesive tape 112. Such depth may range between approximately 0.00 mm and 0.05 mm. The adhesive tape 112 may be a thick ultraviolet (UV) tape.

In step 156, the wafer 110 is sawed into the individual dies 106 (see FIG. 4). The path sawed by the blade 120 follows the spacing width between the dies 106. The blade 120 does not cut the adhesive tape 112. The kerf is a wide sawing kerf, as further detailed below.

In step 158, the molding compound 130 is applied to the sawed wafer 110 (see FIG. 5). The molding compound 130 covers the dies and fills in the kerfs between the dies. As the adhesive tape 112 has not been cut, the cut dies 106 are held in place by the adhesive tape 112. The adhesive tape 112 and the wafer 110 may be placed in the mold chase at the same time. The molding compound 130 fills from the top of the mold chase and fills all the space from the bottom of the dies 106 to the bumps 104. Because the bumps 104 are caved into the tape a certain depth, the bumps 104 will stand out of the compound between approximately 0.00 mm to 0.05 mm. During this stage, a fine filler size compound may be used. After the molding compound 130 has set sufficiently, the process continues to step 160.

In step 160, the blade 140 saws the molded wafer resulting from step 158 (see FIG. 6). The path of the blade 140 follows the kerfs between the dies that were cut by the blade 120 (see step 156) and that were filled with molding compound (see step 158). After having been sawed this second time, the individual CSPs 100 result (see FIGS. 1B and 1D). At this time, the adhesive tape 112 is cut a sufficient depth to ensure that the compound is fully cut.

After the CSPs 100 have been sawed, a UV lamp cures the tape. Then the tape may be removed from the CSPs 100, and the CSPs 100 may be integrated with other components or otherwise packaged to form a discrete chip.

As mentioned above with regard to step 156, the kerf is a wide sawing kerf. The kerf is a wide sawing kerf in order to provide a space for molding compound to flow and to allow better cutting quality after molding. One example wide kerf may range between approximately 0.3 mm and 0.5 mm.

The spacing width of the wafer 110 (discussed above with reference to FIG. 2) is wide enough to accommodate the wide sawing kerf.

Figure 8A:
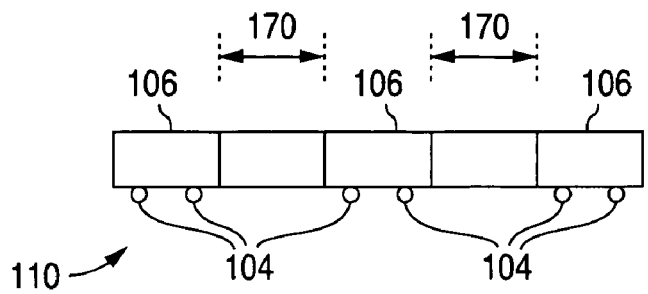
FIGS. 8A-8F are cross-sectional views of a semiconductor wafer as resulting from various steps of the method of FIG. 7 according to an embodiment of the present invention.

FIGS. 8A-8F are cross-sectional views of the wafer 110 at various stages of the method 150 according to an embodiment of the present invention. FIG. 8A is a cross-sectional view showing a portion of the wafer 110 having been fabricated (see step 152 of FIG. 7). The interior structures 106, conductive bumps 104, and the spacing width 170 can be seen.

Figure 8B:
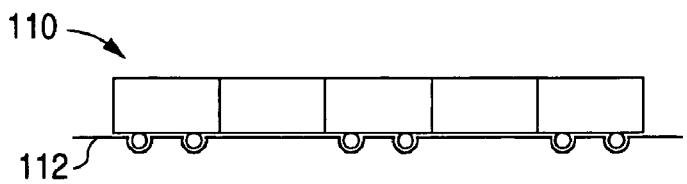

FIG. 8B is a cross-sectional view of the wafer 110 with the adhesive tape 112 having been applied (see step 154 of FIG. 7).

Figure 8C:
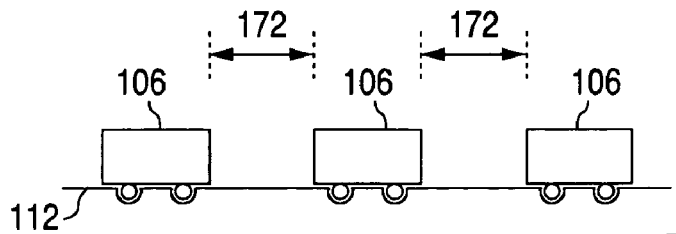

FIG. 8C is a cross-sectional view of the wafer 110 having been sawed (see step 156 of FIG. 7). The kerf 172 can be seen.

Figure 8D:
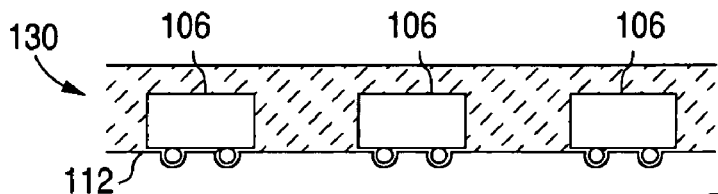

FIG. 8D is a cross-sectional view of the wafer 110 with the molding compound 130 having been applied (see step 158 of FIG. 7).

Figure 8E:
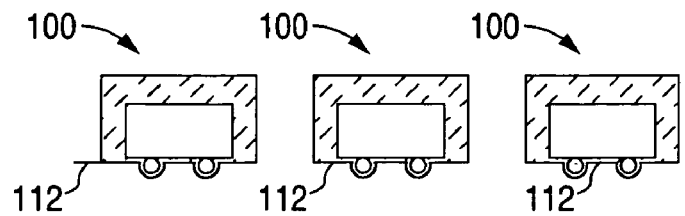

FIG. 8E is a cross-sectional view of the CSPs 100 resulting from the wafer having been sawed the second time (see step 160 of FIG. 7). As shown, because the sawing kerf resulting from the first sawing is wider than a sawing kerf resulting from the second sawing, the individual die may be separated while leaving the molding compound in place to cover the top, bottom, and sidewall surfaces of the die. The adhesive tape 112 has been cut but has not yet been removed from each CSP 100.

Figure 8F:
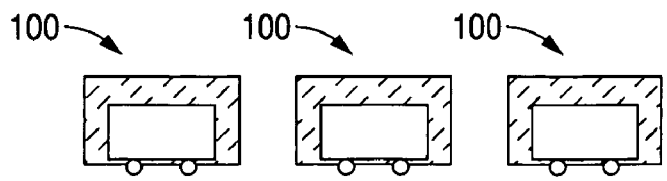

FIG. 8F is a cross-sectional view of the CSPs 100 with the adhesive tape having been removed (see step 160 of FIG. 7).

As can be seen from the above description, embodiments of the present invention improve upon flip chip fabrication processes. A lead frame is unnecessary in embodiments of the present invention. In addition, a flip chip bonder machine is also unnecessary in embodiments of the present invention. With the elimination of these two items, many quality issues that have happened during many existing flip chip bonding processes may be avoided. As a result, the embodiments of the present invention reduce cost, improve reliability, and improve manufacturing yield.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims. The terms and expressions that have been employed here are used to describe the various embodiments and examples. These terms and expressions are not to be construed as excluding equivalents of the features shown and described, or portions thereof, it being recognized that various modifications are possible within the scope of the appended claims.

What is claimed is:

1. A method of assembling a chip scale package (CSP), comprising the steps of:
    mounting a semiconductor wafer on adhesive tape, wherein said semiconductor wafer includes a plurality of conductive bumps on a top side, and said adhesive tape adheres to said top side;
    sawing said semiconductor wafer a first time such that a sawing kerf is obtained;
    molding said semiconductor wafer with a molding compound such that said molding compound is in said sawing kerf;
    sawing said semiconductor wafer a second time such that a plurality of CSPs are formed from said semiconductor wafer; and
    wherein said molding compound covers a top, a bottom, and sidewall surfaces of each semiconductor die.

2. The method of claim 1, wherein said plurality of conductive bumps are formed in accordance with a footprint of a printed circuit board.

3. The method of claim 1, wherein said step of mounting comprises mounting said semiconductor wafer on said adhesive tape such that said plurality of conductive bumps are caved in said adhesive tape.

4. The method of claim 1, further comprising flipping said semiconductor wafer prior to said step of mounting.

5. The method of claim 1, further comprising flipping said semiconductor wafer after said step of mounting.

6. The method of claim 1, wherein said step of sawing said first time results in said semiconductor wafer being sawed into a plurality of dies.

7. The method of claim 1, further comprising molding said semiconductor wafer with said molding compound such that said plurality of conductive bumps are exposed on a surface of said molding compound.

8. The method of claim 1, wherein said sawing kerf has a width of between 0.03 mm and 0.05 mm.

9. The method of claim 1, wherein said sawing kerf resulting from the first sawing is wider than a sawing kerf resulting from the second sawing.

10. A chip scale package (CSP), said CSP produced by a method comprising the steps of:
    mounting a semiconductor wafer on adhesive tape, wherein said semiconductor wafer includes a plurality of conductive bumps on a top side, and said adhesive tape adheres to said top side;
    sawing said semiconductor wafer a first time such that a sawing kerf is obtained;
    molding said semiconductor wafer with a molding compound such that said molding compound is in said sawing kerf;
    sawing said semiconductor wafer a second time such that a plurality of CSPs are formed from said semiconductor wafer;
    wherein said molding compound covers a top, a bottom, and sidewall surfaces of each semiconductor die.

11. The CSP of claim 10, wherein said plurality of conductive bumps are formed in accordance with a footprint of a printed circuit board.

12. The CSP of claim 10, wherein said step of mounting comprises mounting said semiconductor wafer on said adhesive tape such that said plurality of conductive bumps are caved in said adhesive tape.

13. The CSP of claim 10, wherein said method further comprises flipping said semiconductor wafer prior to said step of mounting.

14. The CSP of claim 10, wherein said method further comprises flipping said semiconductor wafer after said step of mounting.

15. The CSP of claim 10, wherein said step of sawing said first time results in said semiconductor wafer being sawed into a plurality of dies.

16. The CSP of claim 10, wherein said method further comprises molding said semiconductor wafer with said molding compound such that said plurality of conductive bumps are exposed on a surface of said molding compound.

17. The CSP of claim 10, wherein said sawing kerf has a width of between 0.03 mm and 0.05 mm.

18. The CSP of claim 10, wherein said sawing kerf resulting from the first sawing is wider than a sawing kerf resulting from the second sawing.

* * * * *